United States Patent [19]

Tuckerman et al.

[11] 4,450,472

[45] May 22, 1984

[54] METHOD AND MEANS FOR IMPROVED HEAT REMOVAL IN COMPACT SEMICONDUCTOR INTEGRATED CIRCUITS AND SIMILAR DEVICES UTILIZING COOLANT CHAMBERS AND MICROSCOPIC CHANNELS

[75] Inventors: David B. Tuckerman; Roger F. W. Pease, both of Stanford, Calif.

[73] Assignee: The Board of Trustees of the Leland Stanford Junior University, Stanford, Calif.

[21] Appl. No.: 239,407

[22] Filed: Mar. 2, 1981

[51] Int. Cl.$^3$ .......................... H01L 25/04; F28F 7/00
[52] U.S. Cl. .................................... 357/82; 165/80 C
[58] Field of Search ......................... 357/82; 165/80 C

[56] References Cited

PUBLICATIONS

"Liquid Cooling of Integrated Circuit Chips" W. Anacker *IBM Technical Disclosure Bulletin*, vol. 20, No. 9, Feb. 1978, pp. 3742–3743.
"Integrally Grooved Semiconductor Chip and Heat Sink" A. H. Johnson *IBM Technical Disclosure Bulletin*, vol. 14, No. 5, Oct.1971, p. 1425.
"Heat Transfer from Silicon Chips and Wafers" R. W. Noth *IBM Technical Disclosure Bulletin*, vol. 17, No. 12, May 1975, p. 3544.
"Heat Exchange Element for Semiconductor Device Cooling" H. D. Edmonds and G. Markovits *IBM Technical Disclosure Bulletin*, vol. 23, No. 3, Aug. 1980, p. 1057.
"Grooved Substrate Boosts IC Cooling", *Electronics*, Aug. 25, 1982, p. 46.

*Primary Examiner*—Andrew J. James
*Assistant Examiner*—Seth Nehrbass
*Attorney, Agent, or Firm*—Flehr, Hohbach, Test, Albritton & Herbert

[57] ABSTRACT

A semiconductor chip having improved heat dissipation capability. The back surface of a semiconductor chip is provided with microscopic channels defined by fins in intimate contact with the chip. A cover is affixed to the fins to enclose the channels for the laminar flow of coolant fluid. The chip can be mounted in a recessed portion of a dual in-line package (DIP) with conductive tubes integral with the package providing the flow of coolant. Advantageously, the tubes can function as power busses to the integrated circuit.

17 Claims, 8 Drawing Figures

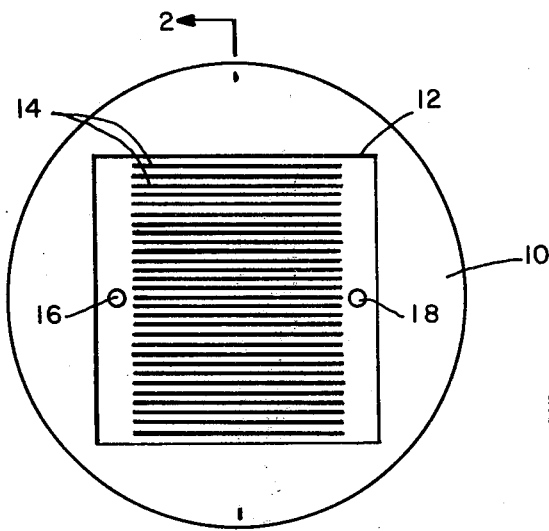
FIG.—1
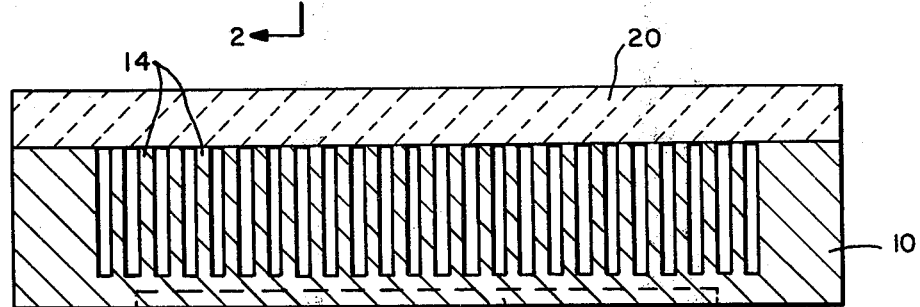
FIG.—2
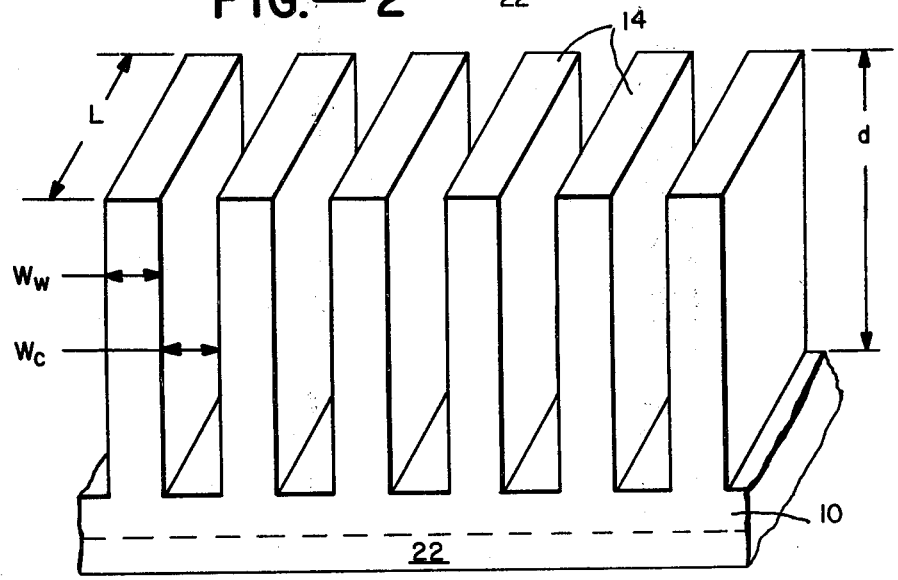
FIG.—3

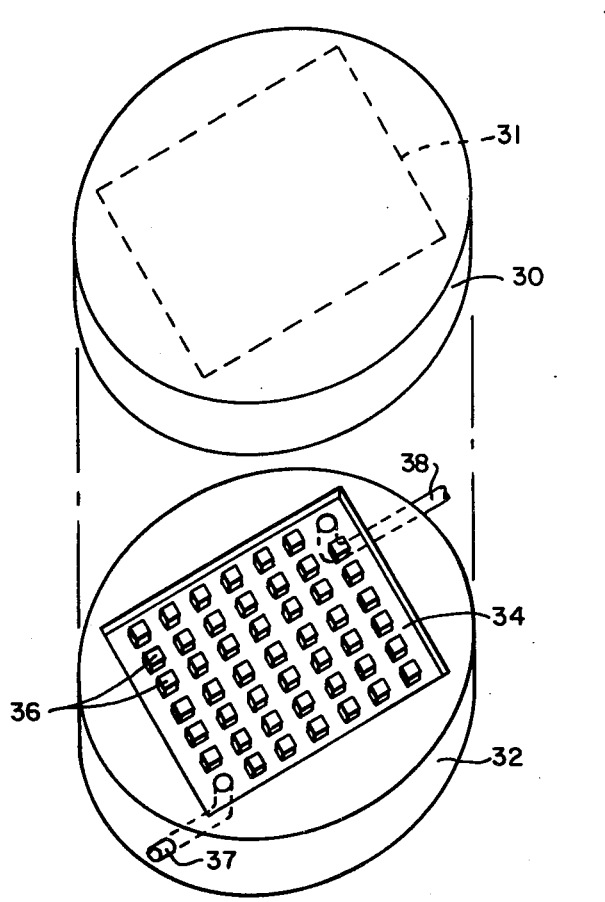
FIG.—4
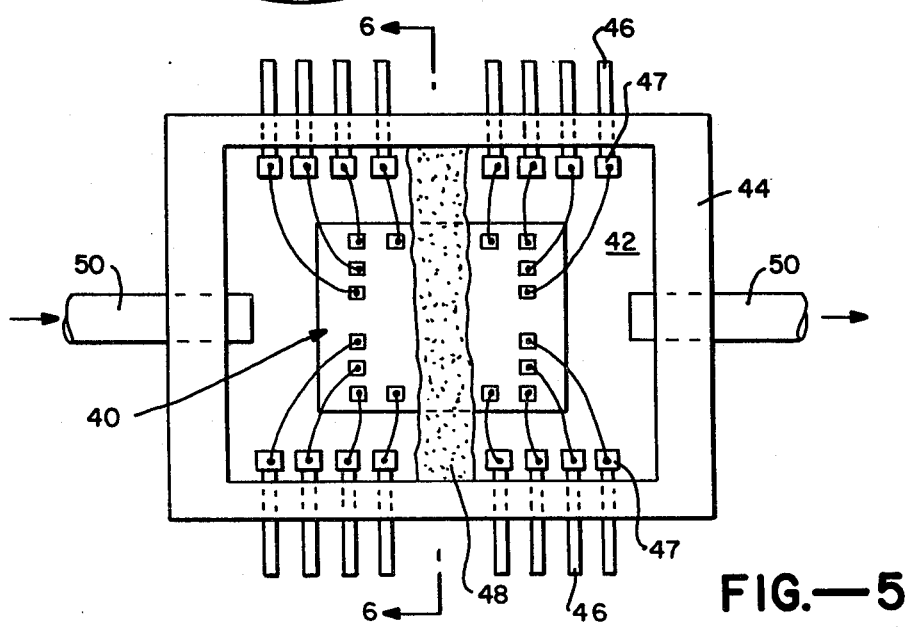
FIG.—5

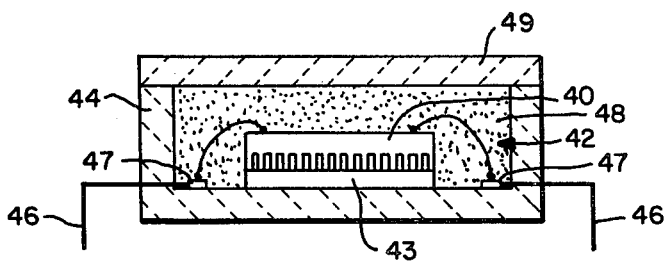
FIG.—6
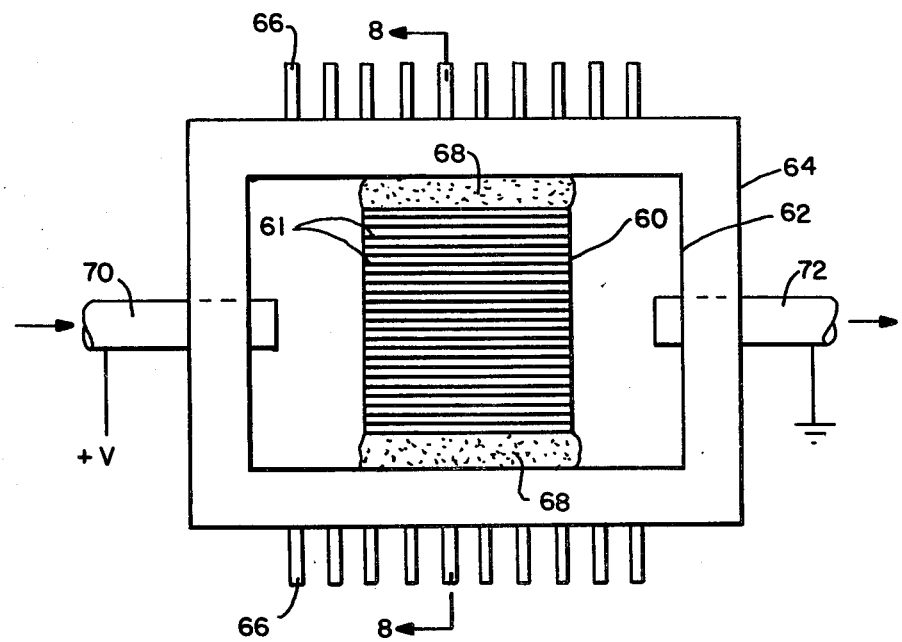
FIG.—7
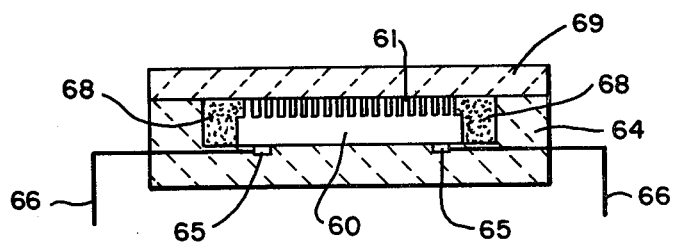
FIG.—8

METHOD AND MEANS FOR IMPROVED HEAT REMOVAL IN COMPACT SEMICONDUCTOR INTEGRATED CIRCUITS AND SIMILAR DEVICES UTILIZING COOLANT CHAMBERS AND MICROSCOPIC CHANNELS

This invention relates generally to heat generating devices, and more particularly the invention relates to compact devices such as semiconductor integrated circuits and a method and means for removal of heat from such devices.

Advances in semiconductor processing and circuit design have led to increased component density in very large scale integrated circuit arrays (VLSI). While the individual components making up such circuits operate at low voltage and draw very low currents, the increased density of components in such circuits has a consequential increase in heat generated per unit area of semiconductor chip surface. This has necessitated the use of heat sinks to facilitate removal of heat from the surface.

Heretofore, heat conducting pedestals have been mounted on semiconductor chips and packages for heat removal to an air or fluid coolant. Proposals have been suggested for engaging the semiconductor chips directly with the coolant.

In using a coolant for heat removal, turbulent flow of the coolant has been considered necessary to maximize heat removal, laminar coolant flow has been avoided. Further, turbulent flow has been necessary because of large dimensions of heat fins and ducts heretofore employed in heat sinks. As a result, the prior art heat dissipation assemblies are often larger than the heat generating devices.

An object of the present invention is an improved method of removing heat from a heat generating device.

Another object of the invention is a compact heat dissipating structure having low thermal resistance.

Another object of the invention is a semiconductor integrated circuit having improved power dissipation capability.

Yet another object of the invention is a compact heat dissipation assembly.

Still another object of the invention is a semiconductor integrated circuit and package which incorporates heat removal structure with electrical power busses.

A feature of the invention is the use of microscopic heat conducting fins in intimate contact with a semiconductor chip for defining constricted channels.

Another feature of the invention is the use of laminar coolant flow for removing heat from a semiconductor chip.

Briefly, in accordance with the invention microscopic heat fins are provided in integral contact with a heat generating device such as a chip and a coolant engages the fins in laminar flow for heat removal. The physical dimensions of the fins and channels are optimized for the particular material and coolant employed.

In a preferred embodiment, the back surface of a semiconductor chip includes a recessed portion with heat conducting fins rising from the recessed portion. A planar member engages the back surface and the tops of the fins to define a coolant chamber. A coolant input line and a coolant output line communicate the coolant to and from the chamber whereby the coolant flows laminarly in constricted channels between the fins.

In another embodiment, the back surface of a semiconductor chip includes heat conducting fins which extend across the chip. The chip is mounted in a package having coolant input and output tubes whereby coolant flows in constricted channels within the back surface of the chip. Advantageously, the input and output tubes can function as power busses to the chip.

The invention and objects and features thereof will be more readily apparent from the following detailed description and appended claims when taken with the drawing, in which:

FIG. 1 is a rear view of a semiconductor integrated circuit chip in accordance with one embodiment of the invention.

FIG. 2 is a sectional view of the chip of FIG. 1 taken along the line 2—2.

FIG. 3 is an enlarged perspective view of a portion of a semiconductor integrated circuit chip of FIG. 1.

FIG. 4 is a perspective view of a semiconductor integrated circuit chip in accordance with another embodiment of the invention.

FIG. 5 is a front view of a semiconductor integrated circuit chip and package in accordance with another embodiment of the invention.

FIG. 6 is a sectional view of the chip and package of FIG. 5 taken along the lines 6—6 in FIG. 5.

FIG. 7 is a front view of a semiconductor integrated circuit chip and package in accordance with another embodiment of the invention.

FIG. 8 is a sectional view of the chip and package of FIG. 7 taken along the line 8—8 in FIG. 7.

Referring now to the drawings, FIG. 1 is a rear view of a semiconductor integrated circuit chip in accordance with one embodiment of the invention as seen through a transparent cover. The circuit is formed in a front surface of a semiconductor chip 10. The rear surface of the chip includes a recessed portion 12 and a plurality of parallel, microscopic heat conducting fins 14 rising from the recessed portion 12. As used herein, "microscopic" means on the order of a fourth of a millimeter or less. Advantageously, the recessed portion 12 and fins 14 can be fabricated in the semiconductor chip 10 by conventional photoresist masking and chemical etching techniques or other conventional techniques. The transparent cover engages the surface of chip 10 and the tops of the fins 14 thereby defining a chamber for the flow of a coolant through input and output ports 16 and 18 in the transparent cover and in heat conducting contact with fins 14.

As shown in the sectional view in FIG. 2 taken along the line 2—2 of FIG. 1, the cover 20 is affixed to the major surface of chip 10 and to the tops of the heat conducting fins 14 thereby defining a chamber through which the coolant flows in heat conducting contact with the fins 14. Cover 20 can be made of the same semiconductor material as chip 10 or other compatible material such as glass. The cover may be anodically bonded to the chip or otherwise affixed thereto to define the liquid tight chamber. The fins 14 are positioned above the circuit shown generally at 22 in the front surface.

Unlike heat conducting fins heretofore proposed for use in cooling semiconductor integrated circuits, the fins 14 in accordance with the present invention are microscopic in dimensions (e.g. on the order of 0.1 millimeter in width). Because of the microscopic dimensions, the coolant is passed through the channels defined by the fins in laminar flow. FIG. 3 is a perspective view of an enlarged portion of the semiconductor chip of FIG. 1 with the width of each fin designated $W_w$, the width of each channel designated $W_c$, the length of each fin designated L, and the depth of each fin designated d.

The specific values of $W_c$, $W_w$ can be determined for various liquids and fin materials provided that the heat conductivity of the liquid is much less than that of the fin material.

Preferably the channels are made as narrow as $$W_c = \sqrt[4]{\frac{36 Nu \, \mu k_l L^2}{\rho CP}} \text{ (cm)}$$

where
- $\mu$ = viscosity of coolant in poise (g cm$^{-1}$ s$^{-1}$)
- $k_l$ = thermal conductivity of coolant (W cm$^{-1}$ K$^{-1}$)
- $\rho C$ = volumetric heat capacity of coolant (J K$^{-1}$ cm$^{-3}$)
- P = driving pressure for forced convection (dynes cm$^{-2}$)
- L = length of circuit substrate in direction of flow (cm)

Nu is the Nusselt number which for long channels typically takes values from 3 to 9 depending on the ratio of channel depth d to channel width $w_c$.

With water coolant and silicon fins the optimum channel width $W_c$ is approximately 0.065 mm for L=10 mm and P=15 p.s.i.

For all materials the value of $W_c$ should approximate that of $W_w$ to give the best heat transfer.

The value of the aspect ratio $d/(W_c+W_w)$ should be preferably $[k_{fin}/(2k_l Nu)]^{\frac{1}{2}}$ because the thermal resistance of the assembly, i.e., the circuit temperature rise per unit of power dissipated, rapidly decreases as the aspect ratio increases to that value but only decreases slowly as the aspect ratio increases beyond that value.

The channel width, $W_c$, for a channel not having a rectangular cross-section, is defined as twice the maximum value of the least distance from any point in the channel to a confining side wall.

For silicon fins with a laminar flow water coolant, this preferably aspect ratio is approximately 4:1. Hence for water cooled silicon the ratio of channel depth to width is about 8:1.

In one embodiment of the invention the back surface of a silicon integrated circuit chip was anisotropically etched to give vertical walled fins of high aspect ratio. A Pyrex plate was bonded to the back of the substrate to confine the fluid to the channels. The fins were 300 microns high, 50 microns wide, with 50 micron channels between fins. A flow of room temperature water at approximately 9 milliliters per second at 31 psi pressure was above to remove 790 Watts over a square centimeter with a 71° C. maximum rise in device temperature.

FIG. 4 is a perspective view of an alternative embodiment of the invention in which a first semiconductor chip 30 having an integrated circuit 31 defined in one major surface has a second heat conductive planar member 32 mounted on the opposite major surface for heat removal. The top surface of the planar member 32 has a recessed portion 34 defined therein with the plurality of rows of fins 36 being discontinuous. Thus, each row of fins comprises a plurality of posts. The heat conducting fins 36 and the member 32 are in intimate thermal contact with the integrated circuit chip 30 by means of suitable adhesive such as solder or epoxy. Coolant is provided to the chamber 34 through the input and output lines 37 and 38.

FIGS. 5 and 6 are respectively front and end sectional views of another very compact embodiment of the invention. The semiconductor chip 40 includes the microscopic channels which run from one end to the other and a cover plate 43 is bonded to the back surface so as to enclose the channels. The assembly of chip 40 and cover plate 43 is mounted in a recessed portion 42 of a support shown generally as 44. The support 44 may be the conventional dual-in-line package (DIP) in which a plurality of conducting leads 46 extend from either side of the package and are interconnected with bonding pads 47 within the recessed portion 42. Wire connections are made from the circuit to the bonding pads 47. Lid 49 (not shown in FIG. 5) encloses the chip 40 in the support 44. A barrier, 48, of epoxy adhesive material serves to divide the recessed portion 42 into two chambers which are connected only by the channels in the chip 40. Preferably, the adhesive material should cover the entire circuit surface. By forcing liquid coolant through one of the pipes 50, the coolant is constrained to flow in the channels and thus bring about the desired cooling.

There are alternative forms of mounting the chip 40 in the recessed portion 42. For example, FIG. 7 is a front view of another embodiment of a semiconductor integrated circuit 60 which is mounted in a recessed portion 62 of a support shown generally at 64, and FIG. 8 is a sectional view taken along the line 8—8 of FIG. 7. The support 64 may again be the conventional dual-in-line package (DIP) in which a plurality of conductive leads 66 extend from either side of the package and are interconnected with bonding pads within the recessed portion 62. In this embodiment bonding pads of chip 60 are mounted on the pads 65 at the support 64 whereby the integrated circuit is interconnected with the leads 66. In this embodiment a suitable epoxy 68 is positioned about opposite sides of the chip 60 whereby the recessed portion 62 defines a coolant chamber when a cover 69 is mounted to the package 64 and abutts fins 61 of chip 60. A first tube 70 integral with the package provides a coolant to the chamber with the coolant laminarly flowing through the channels defined by the fins 61 of the semiconductor chip 60 to a second tube 72 for removal of the coolant. Advantageously, tubes 70 and 72 can be made of electrically conductive material and function as power busses to the integrated circuit chip 60.

As above described, the invention has proved to offer a significant increase in heat removal capacity for integrated circuit arrays. While the invention has been described with reference to specific embodiments, the descriptions are illustrative of the invention and are not to be construed as limiting the invention. For example, the flow of the coolant through the channels between the microscopic fins can be provided by gravity flow by mounting the semiconductor chips vertically. The channels can be formed by techniques other than chemical etching such as by laser scribing, reactive ion etching, electroplating, and ultrafine sawing. Phosphosilicate-glass reflow can be used in attaching the cover to the chip. Accordingly, various modifications and adaptations may occur to those skilled in the art without departing from the true spirit and scope of the invention as defined by the appended claims.

What is claimed is:

1. A heat generating device having improved heat removal capability comprising: a body portion having an external surface for cooling; a plurality of microscopic channels defined by fins in intimate contact with said external surface, the width of said channels being defined by $$W_C = \sqrt[4]{\frac{36\,Nu\,\mu k_l L^2}{\rho CP}}$$

where
 $\mu$ = viscosity of coolant in poise (g cm$^{-1}$ s$^{-1}$)
 $k_l$ = thermal conductivity of coolant (W cm$^{-1}$ K$^{-1}$)
 $\rho C$ = volumetric heat capacity of coolant (J K$^{-1}$ cm$^{-3}$)
 P = driving pressure for forced convection (dynes cm$^{-2}$)
 L = length of circuit substrate in direction of flow (cm)
 $W_c$ = width of channels (cm)
 Nu = Nusselt number;
a coolant input chamber and a coolant output chamber, said chambers being connected by said channels; and a cover attached to said fins and to said chambers, to confine the flow of a coolant fluid through said channels.

2. A heat generating device as defined by claim 1 and further including means for flowing a coolant fluid through said channels.

3. A heat generating device as defined by claim 1 or 2 wherein the channel width and the fin width are approximately equal.

4. A heat generating device as defined by claim 1 or 2 wherein said channels have a depth that is greater than channel width to thereby increase the fin area in contact with a coolant.

5. A heat generating device as defined by claim 4 wherein said fins have a height to period ratio defined by $[k_{fin}/(2k_l Nu)]^{\frac{1}{2}}$ where
 $k_{fin}$ = thermal conductivity of said fin material
 $k_l$ = thermal conductivity of said coolant
 Nu = Nusselt number.

6. A semiconductor integrated circuit having improved heat removal capability comprising:
 a semiconductor body having an integrated circuit defined in a first major surface;
 a plurality of microscopic channels defined by fins in intimate contact with a second major surface opposite from said first surface, the width of channels being defined by $$W_C = \sqrt[4]{\frac{36\,Nu\,\mu k_l L^2}{\rho CP}}$$

where
 $\mu$ = viscosity of coolant in poise (g cm$^{-1}$ s$^{-}$)
 $k_l$ = thermal conductivity of liquid (W cm$^{-1}$ K$^{-1}$)
 $\rho C$ = volumetric heat capacity of liquid (J K$^{-1}$ cm$^{-3}$)
 P = driving pressure for forced convection (dynes cm$^{-2}$)
 L = Length of circuit substrate in direction of flow (cm)
 $W_C$ = width of channels (cm)
 Nu = Nusselt number;
a coolant input chamber and a coolant output chamber, said chambers being connected by said channels;
 a cover attached to said fins and to said chambers to confine the flow of coolant fluid through said channels; and
 means for uniformly distributing coolant fluid through said channels.

7. A semiconductor integrated circuit as defined by claim 6 wherein said microscopic fins and said chambers are formed in a recessed region of said second major surface, said cover engaging said major surface and defining a coolant chamber in said recessed region.

8. A semiconductor integrated circuit as defined by claim 6 and further including a second thermally conducting chip, said microscopic channels and said chambers being defined by fins in a major surface of said second chip, said major surface of said second chip and said fins being affixed in intimate thermal contact to said second major surface of said first chip.

9. A semiconductor integrated circuit as defined by claim 6, 7, or 8 wherein the channel width and the fin width are approximately equal.

10. A semiconductor integrated circuit as defined by claim 6, 7 or 8 wherein said channels have a depth that is greater than channel width to thereby increase the fin area in contact with a coolant.

11. A semiconductor integrated circuit array as defined by claim 10 wherein said fins have a height to period ratio defined by $[k_{fin}/(2k_l Nu)]^{\frac{1}{2}}$ where
 $k_{fin}$ = thermal conductivity of said fin material
 $k_l$ = thermal conductivity of said coolant
 Nu = Nusselt number.

12. A semiconductor integrated circuit as defined by claim 6, 7, or 8 wherein said fins comprise continuous parallel rows of semiconductor material.

13. A semiconductor integrated circuit as defined by claim 6, 7, or 8 wherein said fins comprise parallel rows of semiconductor material with each row being discontinuous.

14. A semiconductor integrated circuit and package having improved heat removal capability comprising:
 a support member having a recessed portion in a major surface; a plurality of bonding pads within said recessed portion; and a plurality of conductive leads extending from said support member and in electrical contact with said bonding pads;
 a semiconductor integrated circuit chip having an integrated circuit defined in a first major surface and having a plurality of microscopic fins in integral contact with a second major surface opposite from said first major surface, said semiconductor integrated chip mounted in said recessed portion with said integrated circuit in electrical contact with said bonding pads;
 a first tube for applying a coolant fluid to one end of said recessed portion and a second tube for removing coolant from a second end of said recessed portion opposite from said first end; and
 a cover affixed to said fins and defining microscopic channels whereby coolant fluid flows from said first tube through said channels and then to said second tube, the width of said fins being defined by $$W_C = \sqrt[4]{\frac{36 \, Nu \, \mu k_l L^2}{\rho CP}}$$

where
- $\mu$ = viscosity of coolant in poise (g cm$^{-1}$ s$^{-1}$)
- $k_l$ = thermal conductivity of coolant (W cm$^{-1}$ K$^{-1}$)
- $\rho C$ = volumetric heat capacity of coolant (J K$^{-1}$cm$^{-3}$)
- P = driving pressure for forced convection (dynes cm$^{-2}$)
- L = length of circuit substrate in direction of flow (cm)
- $W_C$ = width of channels (cm)
- Nu = Nusselt number;

and wherein said fins have a height to period ratio defined by $$[k_{fin}/(2k_l Nu)]^{\frac{1}{2}}$$

where
- $k_{fin}$ = thermal conductivity of said fin material
- $k_l$ = thermal conductivity of said coolant
- Nu = Nusselt number.

15. A semiconductor integrated circuit and package as defined by claim 14 wherein said cover engages said package and encloses said recessed portion.

16. A semiconductor integrated circuit and package as defined by claim 14 or 15 wherein said first tube and said second tube comprise electrically conductive material and function as power busses to said integrated circuit.

17. A semiconductor integrated circuit and package as defined by claim 14 or 15 wherein said tubes are integral with said support member.

* * * * *

UNITED STATES PATENT AND TRADEMARK OFFICE
CERTIFICATE OF CORRECTION

PATENT NO. : 4,450,472

DATED : May 22, 1984

INVENTOR(S) : David B. Tuckerman, et al.

It is certified that error appears in the above-identified patent and that said Letters Patent is hereby corrected as shown below:

At Column 1, line 7, just below the title, insert:

--This invention was made with Government support under Contract DAAG29-79-C-0047 awarded by the DARPA. The Government has certain rights in this invention.--

Signed and Sealed this

Thirty-first Day of January, 1995

*Attest:*

BRUCE LEHMAN

*Attesting Officer*   *Commissioner of Patents and Trademarks*